(12) United States Patent
Chou et al.

(10) Patent No.: US 11,664,793 B2
(45) Date of Patent: *May 30, 2023

(54) METHOD AND APPARATUS FOR PRECISION PHASE SKEW GENERATION

(71) Applicant: Taiwan Semiconductor Manufacturing Co., Ltd., Hsinchu (TW)

(72) Inventors: Mao-Hsuan Chou, Hsinchu County (TW); Ya-Tin Chang, Hsin-Chu (TW); Ruey-Bin Sheen, Taichung (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,227

(22) Filed: Jan. 7, 2022

(65) Prior Publication Data

US 2022/0131536 A1 Apr. 28, 2022

Related U.S. Application Data

(63) Continuation of application No. 16/952,630, filed on Nov. 19, 2019, now Pat. No. 11,228,304, which is a (Continued)

(51) Int. Cl.
*H03K 5/14* (2014.01)
*H03L 7/089* (2006.01)
(Continued)

(52) U.S. Cl.
CPC ............... *H03K 5/14* (2013.01); *H03K 5/135* (2013.01); *H03L 7/0891* (2013.01); *H03K 2005/00104* (2013.01)

(58) Field of Classification Search
CPC ...................... H03K 5/14; H03K 5/135; H03K 2005/00104; H03L 7/0891; H03L 7/081; (Continued)

(56) References Cited

U.S. PATENT DOCUMENTS

| 7,019,571 B2 | 3/2006 | Lim |
| 8,390,349 B1 | 3/2013 | Ravi |

(Continued)

FOREIGN PATENT DOCUMENTS

| CN | 102210102 A | 10/2011 |
| CN | 105071799 A | 11/2015 |

(Continued)

*Primary Examiner* — John W Poos
(74) *Attorney, Agent, or Firm* — Duane Morris LLP

(57) ABSTRACT

A method and apparatus of generating precision phase skews is disclosed. In some embodiments, a phase skew generator includes: a charge pump having a first mode of operation and a second mode of operation, wherein the first mode of operation provides a first current path during a first time period, and the second mode of operation provides a second current path during a second time period following the first time period; a sample and hold circuit, coupled to a capacitor, and configured to sample a voltage level of the capacitor at predetermined times and provide an output voltage during a third time period following the second time period; and a voltage controlled delay line, coupled to the sample and hold circuit, and having M delay line stages each configured to output a signal having a phase skew offset with respect to preceding or succeeding signal.

20 Claims, 7 Drawing Sheets

Related U.S. Application Data continuation of application No. 16/436,761, filed on Jun. 10, 2019, now Pat. No. 10,848,138.

(60) Provisional application No. 62/734,427, filed on Sep. 21, 2018.

(51) Int. Cl.
*H03K 5/135* (2006.01)
*H03K 5/00* (2006.01)

(58) Field of Classification Search
CPC ....... H03L 7/091; H03L 7/0996; H03L 7/104; H03L 7/0814; H03L 7/0895
See application file for complete search history.

(56) References Cited

U.S. PATENT DOCUMENTS

| | | | |
|---|---|---|---|
| 8,427,205 B1 | 4/2013 | Nagaraj et al. | |
| 8,773,182 B1 | 7/2014 | Degani | |
| 9,705,515 B1 | 7/2017 | Lee | |
| 10,523,218 B2 | 12/2019 | Kuan et al. | |
| 2002/0036525 A1 | 3/2002 | Hwang | |
| 2002/0136342 A1 | 9/2002 | Lee | |
| 2003/0133522 A1 | 7/2003 | Staszewski | |
| 2007/0176656 A1* | 8/2007 | Lesso | H03L 7/0812 327/158 |
| 2007/0216489 A1 | 9/2007 | Krishnan et al. | |
| 2009/0219187 A1 | 9/2009 | Sun | |
| 2010/0117700 A1 | 5/2010 | Raghunathan | |
| 2012/0049914 A1 | 3/2012 | Pellerano | |
| 2012/0319749 A1 | 12/2012 | Thaller | |
| 2013/0223564 A1 | 8/2013 | Mayer | |
| 2014/0266848 A1 | 9/2014 | Henzler | |
| 2016/0056827 A1 | 2/2016 | Machogiannakis | |
| 2017/0329284 A1 | 11/2017 | Wu | |
| 2018/0181077 A1 | 6/2018 | Salle | |
| 2019/0007055 A1 | 1/2019 | Nelson | |
| 2019/0068205 A1 | 2/2019 | Tamura | |
| 2019/0199361 A1 | 6/2019 | Sudalaiyandi | |
| 2019/0280649 A1 | 9/2019 | Janardhanan | |
| 2019/0384230 A1 | 12/2019 | Dgani | |
| 2020/0076439 A1 | 3/2020 | Weeks | |
| 2020/0132764 A1 | 4/2020 | Chou | |
| 2020/0174427 A1 | 6/2020 | Fujimoto | |
| 2020/0192301 A1 | 6/2020 | Khoury | |
| 2020/0195263 A1 | 6/2020 | Khoury | |

FOREIGN PATENT DOCUMENTS

| | | | | |
|---|---|---|---|---|
| CN | 109842413 A | * | 6/2019 | ........... H03L 7/0802 |
| EP | 1819051 A2 | * | 8/2007 | ........... H03L 7/0812 |
| TW | 200733566 A | | 9/2007 | |
| TW | 201414208 A | | 4/2014 | |
| TW | 201832039 A | | 9/2018 | |
| WO | WO-2013154585 A1 | * | 10/2013 | ........... H03L 7/0802 |

* cited by examiner

METHOD AND APPARATUS FOR PRECISION PHASE SKEW GENERATION

CROSS-REFERENCE TO RELATED APPLICATION

This application is a continuation of U.S. patent application Ser. No. 16/952,630, filed Nov. 19, 2020, which is a continuation application of U.S. patent application Ser. No. 16/436,761, filed Jun. 10, 2019, which claims priority to U.S. Provisional Patent Application No. 62/734,427, filed on Sep. 21, 2018, which is incorporated by reference herein in its entirety.

BACKGROUND

Generating precision phase skews using traditional delayed locked loops (DLLs) is difficult and expensive. Traditional delayed locked loops (DLLs) typically include a phase detector (PD), charge pump (CP), loop filter and a voltage-controlled delay line (VCDL). The PD detects the phase skew between an input clock and an output clock of the DLL fed back to the PD. The charge pump and loop filter translates phase error to voltage signal, which is then provided to an input of the VCDL. In response to a magnitude of the voltage signal input, the VCDL adjusts the delay time of the input clock to make the overall delay time the same as the period of the input clock.

In order to generate a phase skew which is proportional to the input clock period by a factor of 1/M, conventional approaches must provide M delay line stages in the VCDL, where M can be a large number. Such a large number of delay line stages requires significant integrated circuit (IC) "real estate." Additionally, in order to adjust the ratio M, the number of delay stages in the VCDL must be adjustable, which requires complex circuitry. Such circuitry would require N stages in the VCDL, where N is greater than M, and use a multiplexer to select the M stage output of the multi-stage configurable VCDL. It is difficult to characterize the delay time of the multiplexer, which affects the phase skew (Δθ) accuracy because the delay time of the multiplexer can be significant. Thus, methods of generating precision phase skews (Δθ) using conventional DLL architectures are not entirely satisfactory.

The information disclosed in this Background section is intended only to provide context for various embodiments of the invention described below and, therefore, this Background section may include information that is not necessarily prior art information (i.e., information that is already known to a person of ordinary skill in the art).

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION OF EXEMPLARY EMBODIMENTS

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
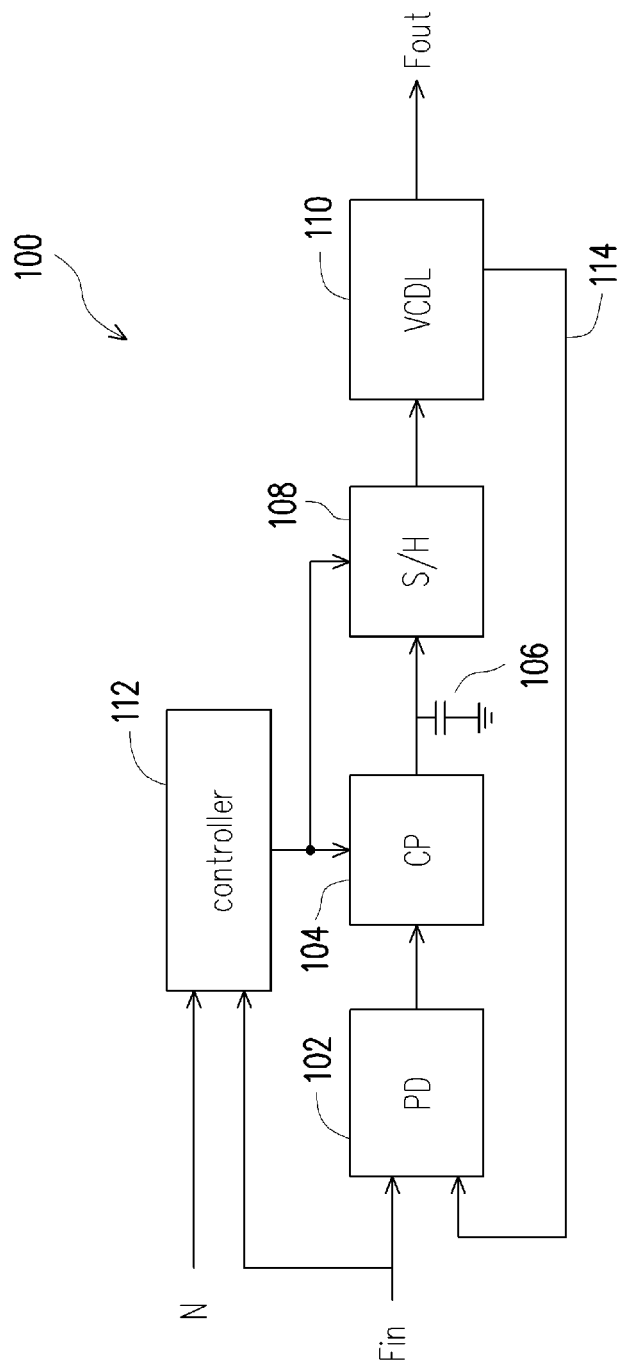
FIG. 1 is a block diagram of phase skew generator, in accordance with some embodiments of the disclosure.

FIG. 1 illustrates a block diagram of a phase skew generator 100, in accordance with some embodiments of the present disclosure The phase skew generator 100 includes a phase detector (PD) 102, an enhanced charge pump (CP) 104, a capacitor 106 (also referred to herein as a "loop filter), the S/H circuit 108, and voltage controlled delay line (VCDL) 110. A controller 112 is coupled to the CP 104 and the S/H circuit 108 for controlling their operation. The PD 102 includes a first input for receiving an input clock frequency ($F_{IN}$) and a second input for receiving an output clock frequency ($F_{OUT}$) provided to the PD 102 via a feedback path 114 from the VCDL 110. The PD 102 detects a phase error between $F_{IN}$ and $F_{OUT}$ and provides the phase error to the CP 104.

The CP 104 and the loop filter 106 translates the phase error to a voltage ($V_C$), which is provided to the S/H circuit 108, which is configured to sample the voltage value ($V_C$) at specified times as dictated by the controller 112, and hold the voltage value $V_C$ until the next sampling period has started, as discussed in further detail below. The VCDL 110 adjusts the delay time from the input clock signal to provide the output clock signal based on the values of $V_C$ and $V_S$, as discussed in further detail below. In some embodiments, when $V_S$ equals a target $V_S$ value, the phase skew generator is in a stable, locked state, as described in further detail below.

The controller 112 has a first input for receiving the input signal (Fin) and an optional second input for receiving a programming value (N), which is discussed in further detail below. Based on Fin and the optional input N, the controller 112 controls the timing and operation of the CP 104 and the S/H circuit 108, as described in further detail below.

Figure 2:
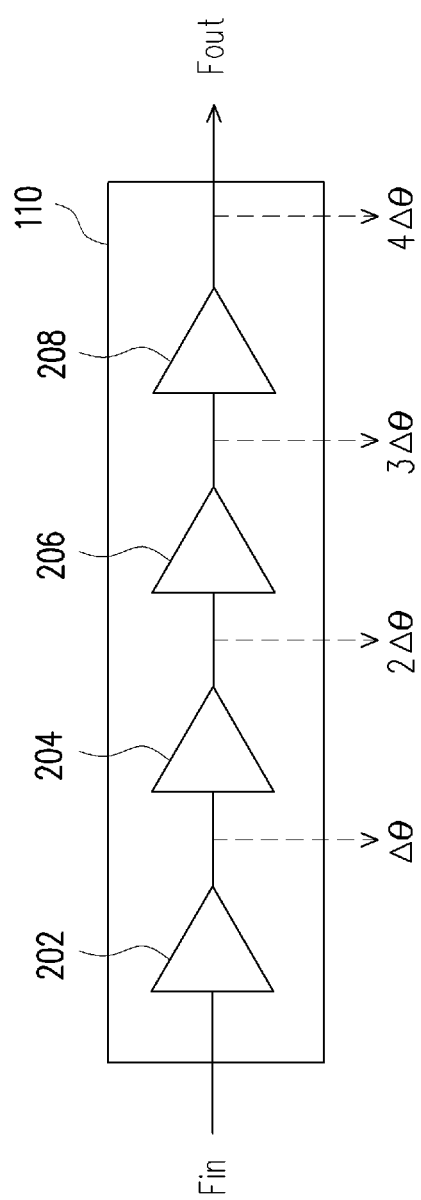
FIG. 2 is a schematic diagram of voltage controlled delay line (VCDL) having four delay line stages, in accordance with some embodiments.

In some embodiments, the VCDL 110 includes only four delay line stages, as shown in FIG. 2, wherein each stage can output a signal with a delay $\Delta\theta$ (referred to herein as "phase skew"). For example, a first stage can output a first signal with delay $\Delta\theta$, a second stage can output a second signal with delay $2\Delta\theta$, a third stage can output a third signal with delay $3\Delta\theta$, and a fourth stage can output a fourth signal with delay $4\Delta\theta$. The VCDL 110 receives the delay tuning signal ($V_S$) from the S/H circuit 108, which is an analog signal in some embodiments, and adjusts the delay time from Fin to Fout of the VCDL 110.

A first delay line stage includes a first buffer 202 for receiving an input signal (Fin) and outputs the first signal with delay $\Delta\theta$, which is then provided as an input to the second delay line stage. The second delay line stage includes a second buffer 204 that outputs the second signal with delay $2\Delta\theta$ to be provided as an input to the third delay line stage. The third delay line stage includes a third buffer 206 that outputs the third signal with delay $3\Delta\theta$, which is then provided as an input to the fourth stage. The fourth stage includes a fourth buffer 208 that outputs the fourth signal with delay $4\Delta\theta$, which is then provided as the output (Fout) of the VCDL 110. In some embodiments, the delay time $\Delta\theta$ is proportional to the magnitude of current of the VCDL 110.

Figure 3:
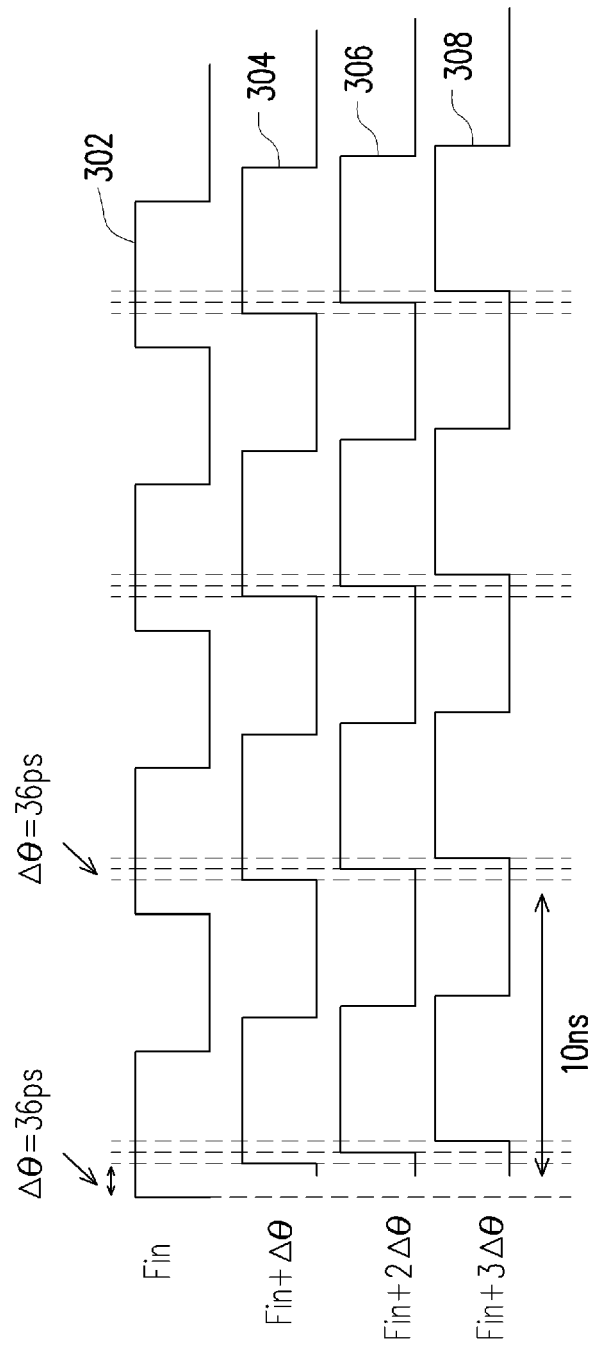
FIG. 3 illustrates a timing diagram of an input signal (Fref) and three delayed output signals of the VCDL of FIG. 2, in accordance with some embodiments.

FIG. 3 illustrates a timing diagram of some of the input and output signals of the VCDL 110, as discussed above, in accordance with some embodiments. The input signal 302 is a square wave signal having a frequency of Fin and period of 1/Fin (Tref). The first signal 304 (output from the first delay stage 202) is also a square wave having the same frequency as the input signal 302 but is offset in phase by an amount $\Delta\theta$. The second signal 306 (output from the second delay stage 204) is also a square wave having the same frequency as the input signal but is offset in phase by an amount $2\Delta\theta$. The third signal 308 (output from the third delay stage 206) is also a square wave having the same frequency as the input signal but is offset in phase by an amount $3\Delta\theta$. As shown in FIG. 3, each of the first, second and third signals 304, 306 and 308, respectively, are offset from one another by a phase skew $\Delta\theta$. Thus, these signals can serve as inputs to any circuit or system wherein input signals having a precise phase skew ($\Delta\theta$) from one another is desired.

Figure 4:
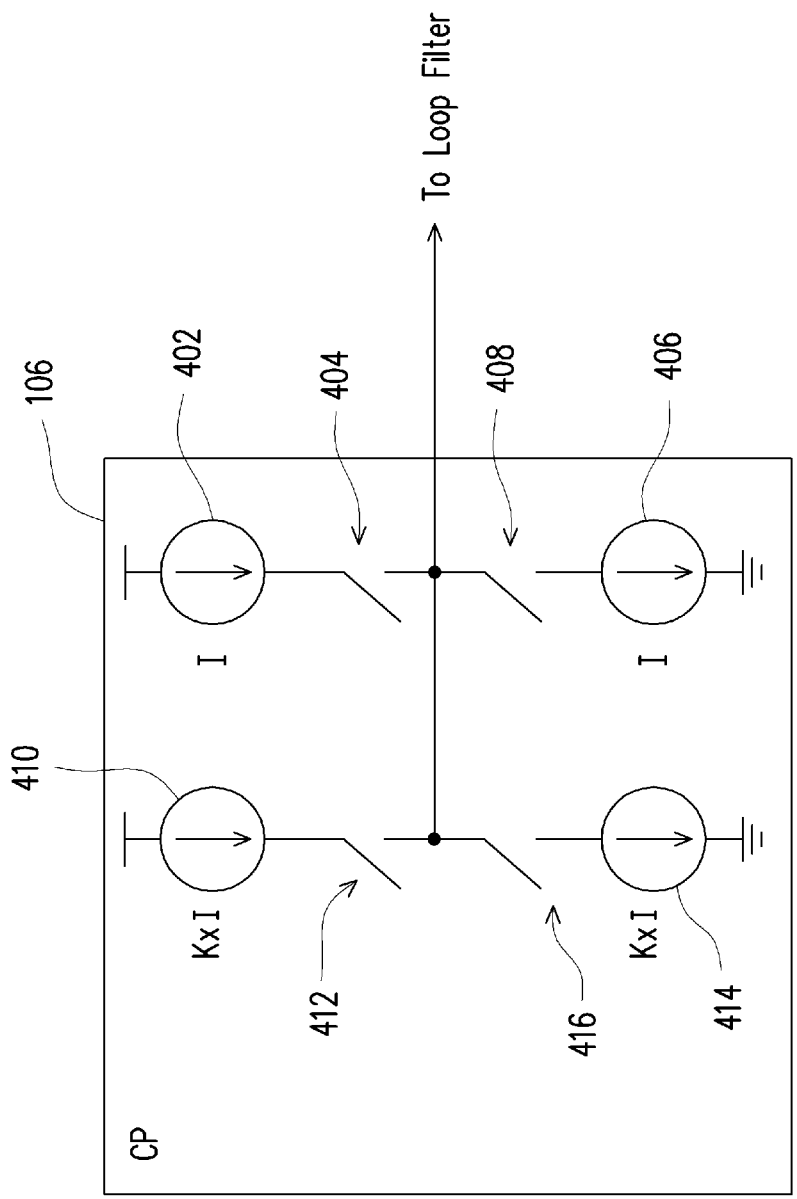
FIG. 4 is a schematic of a charge pump (CP) having a pre-charge current path and a normal operation current path, in accordance with some embodiments.

FIG. 4 illustrates a schematic diagram of an enhanced charge pump (CP) 106, in accordance with some embodiments. The CP 106 includes a pre-charge path comprising a first current source 402 and a first switch 404, controlled by controller 112, that when closed pre-charges the loop filter (capacitor 106) with a pre-charge current I. The CP 106 further includes a second current source 406 and a second switch 408, controlled by the controller 112 and when closed pre-discharges the loop filter 106 with a pre-discharge current I. As shown in FIG. 4, the first current source 402 is disposed between a power source and the first switch 404, while the second current source 406 is disposed between the second switch 408 and ground.

The CP 106 further includes a "normal operation" path comprising a third current source 410 and a third switch 412, controlled by the controller 112, that when closed charges the loop filter 106 with a second current (K×I) that is a multiple (K) times the pre-charge current (I), where K is a positive integer. The normal operation path further includes a fourth current source 414 and a fourth switch 416, controlled by the controller 112, that when closed discharges the loop filter by a third current (K×I) that is a multiple (K) times the pre-charge current (I). As shown in FIG. 4, the first and third current sources 402 and 410 are coupled to a power supply (Vcc) and the second and fourth current sources 406 and 414 are coupled to ground. The first switch 404 is disposed between the first current source 402 and the loop filter 106, the second switch 408 is disposed between the second current source 406 and the loop filter 106, the third switch 412 is disposed between the third current source 410 and the loop filter 106, and the fourth switch 416 is disposed between the fourth current source 414 and the loop filter 106.

The operation of the phase skew generator 100 is described below with respect to FIG. 5, in accordance with some embodiments. When the phase skew generator 100 is in a locked state, the overall VCDL delay time from Fin to Fout is equal to the period (Tref) of Fin. If the frequency of Fin is 100 MHz, its period is 10 ns. If it is desired to generate a phase skew $\Delta\theta$ which is proportional to the input clock period Tref by a ratio 1/276 (i.e., M=276), for example, each delay stage delay time is provided as follows: $\Delta\theta$=10 ns/276~36 ps.

Referring again to FIG. 1, the PD 102 outputs a phase error between Fin and Fout to the CP 104, which then charges (or discharges) the capacitor 106 with a predetermined current, thereby changing the voltage (Vc) of the capacitor 106, which is provided to the S/H circuit 108. The S/H circuit samples and holds Vc at predetermined times and outputs a voltage (Vs) that controls the VCDL 110 to adjust the Fin to Fout delay time $\Delta T$. The controller 112 adjusts the current of the CP 104 (e.g., adjusts value of K) and operation region of the CP 104 (e.g., switches between pre-charge current paths and normal operation current paths) and the timing of the S/H circuit 108 to determine the VCDL delay time.

In some embodiments, the VCDL 110 includes only four delay line stages compared to 276 stages, for example, and the total delay time ($\Delta T$)=$4\Delta\theta$, where $\theta$ is the phase difference or delay provided by each delay line stage. This significant reduction in the number of delay line stages provides significant reductions in the amount of power required by the VCDL 110, and hence the phase skew generator 100 overall. Such a significant reduction in the number of delay line stages also allows for significant reductions in the size of the VCDL 110, thus requiring less space on an integrated circuit (IC) chip. Despite having only 4 delay line stages, for example, the VCDL 110 can still output a plurality of signals having a precision phase skew $\Delta\theta$ (e.g., 36 ps) with respect to one another (e.g., Fd+$\Delta\theta$, Fd+$2\Delta\theta$, Fd+$3\Delta\theta$), as described in further detail below.

Figure 5:
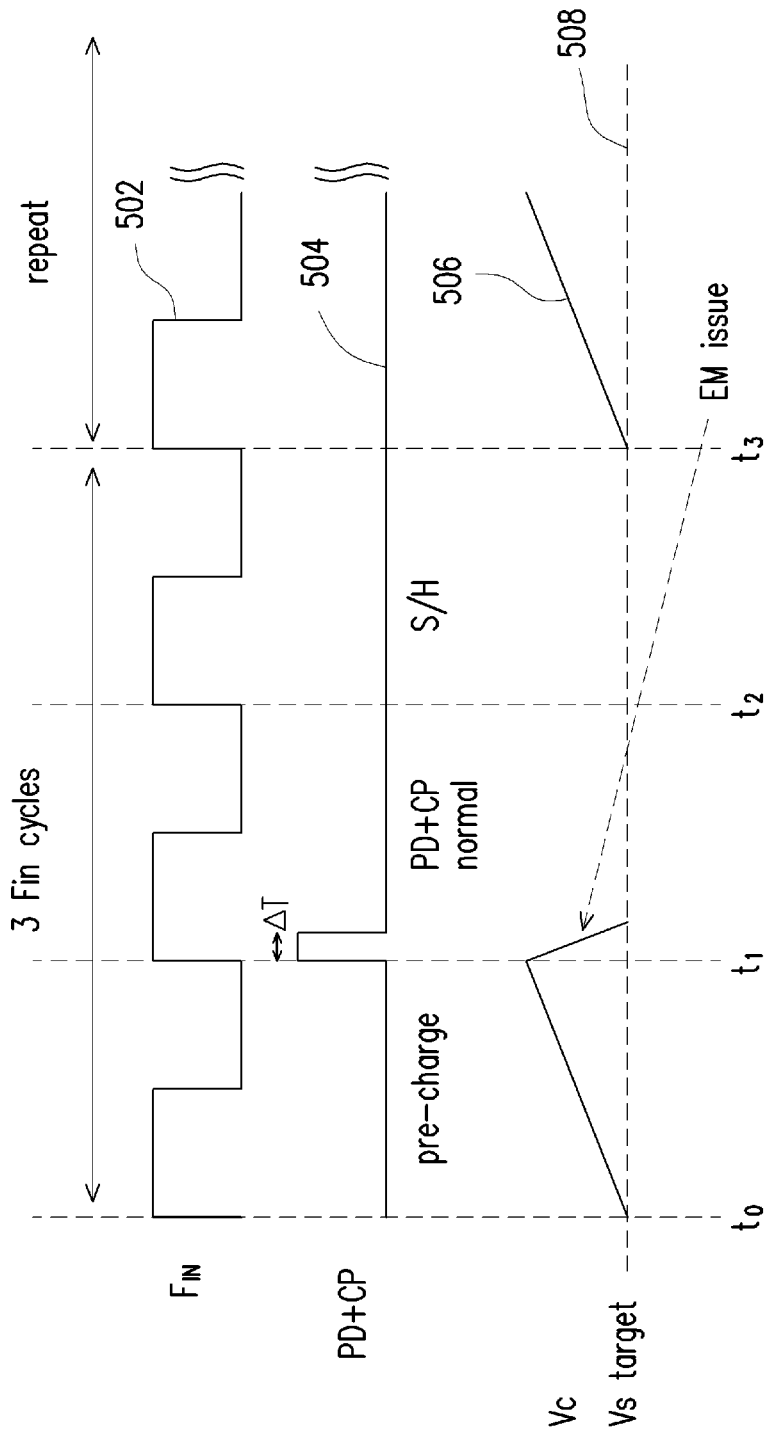
FIG. 5 illustrates a timing diagram of signals of three clock cycles of operation of a phase skew generator divided into three operating regions, in accordance with some embodiments.

FIG. 5 illustrates a timing diagram of input clock Fin 502, a detected phase error $\Delta T$ signal 504 output by the PD 102 and input to the CP 104, a voltage ($V_C$) 506 of the capacitor 106, and a sampled voltage ($V_S$) 508 held by the S/H circuit 108, when the controller 112 divides the operation of the phase skew generator 100 into three operating regions: a pre-charge region, a normal region and a S/H region, in accordance with some embodiments. As shown in FIG. 5, during the pre-charge region, the pre-charge path of the CP 104 charges the capacitor 106 with a unit current. In some embodiments, the unit current can be approximately 10 to 100 micro amps (μA). At time $t_0$, the first switch 404 is closed and the first current source 402 provides the pre-charge current I to charge the capacitor 106, which results in the capacitor voltage $V_C$ to increase from $t_0$ to $t_1$. In some embodiments, the pre-charge region period $(t_1-t_0)$ is the same as the input clock (Fin) period (Tref). Thus, during the pre-charge region, the voltage of the capacitor 106 changes in accordance with the following equation: $\Delta Vc=I/C\times Tref$, where I is the magnitude of the unit current I, C is the capacitance of the capacitor 106 and Tref is the period of the input clock signal having a frequency Fin.

The phase skew generator 100 switches to the normal operation mode from time t1 to time t2. In some embodiments, the normal operation period is the same as one input clock (Fin) period (Tref). In the normal operation region, the PD 102 detects the phase skew (ΔT) between Fin and Fout and provides the ΔT to the CP 104. The CP 104 switches to normal operation mode by opening the first switch 404 and closing the fourth switch 416 to discharge the capacitor 106 with a current K times the unit current I (KI) through the fourth current source 414, where K is an integer greater than or equal to 2. In response, the capacitor 106 provides a voltage ΔVc, where $\Delta Vc=-(KI/C)\times\Delta T$. Thus, ΔVc reflects the phase delay (ΔT) between $F_{IN}$ and $F_{OUT}$.

Following the normal operation region, the phase skew generator 100 enters the sample and hold region from time $t_2$ to $t_3$. In some embodiments, the sample and hold period is the same as one input clock (Fin) period (Tref). During this period, all switches 404, 408, 412 and 416 are in an open state, and the S/H circuit 108 will sample the voltage value of the capacitor 106 at a predetermined time, as controlled by the controller 112, and hold the voltage value until the next sampling period at which time the next voltage value is sampled. The sampled voltage value (Vs) is then provided to the VCDL 110, which outputs the phase difference ΔT based on the value Vs and a target Vs value 508. As shown in FIG. 5, when the difference between $V_S$ and the target Vs is zero (i.e., $\Delta V_{up}$ during pre-charge equals $\Delta V_{down}$ during normal discharge), the phase skew generator 100 will be in a stable, locked state. Thus, in a locked state, $\Delta V_{up}=\Delta V_{down}$, which means $(I\times Tref)/C=(KI\times\Delta T)/C$, or $Tref=K\times\Delta T$. In some embodiments, the target $V_S$ value is equal to the value of $V_C$ at $t_0$. If the value of $V_S$ is larger than the target $V_S$ value, then the phase delay (ΔT) is too small and the VCDL 110 will increase the delay. If the value of $V_S$ is smaller than the target $V_S$ value, then the phase delay (ΔT) is too large and the VCDL 110 will decrease the delay. After any adjustments to the $F_{OUT}$ delay are made, the above-described pre-charge, normal mode and S/H operations are repeated.

If the VCDL 110 includes 4 delay line stages, for example, $\Delta T=4\Delta\theta$. Since $Tref=K\times\Delta T$, as discussed above, if we set the pump current ratio (K) equal to 69, it achieves a phase skew Δθ equal to Tref/(4×69) or Tref/276. If Tref=10 ns, then Δθ equals approximately 30 ps, which is an example of a target precision phase skew. However, due to the large value of K, this approach can suffer from electromagnetic (EM) issues under some scenarios because the CP 104 must consume a large current (e.g., ~1.4 mA) in a very short time (e.g., ~144 ps), leading to a possible EM/circuit issues. In some embodiments, the charge consume by the CP 104 is K times the pre-charge unit current (e.g., 69×20 μA=1.4 mA).

Figure 6:
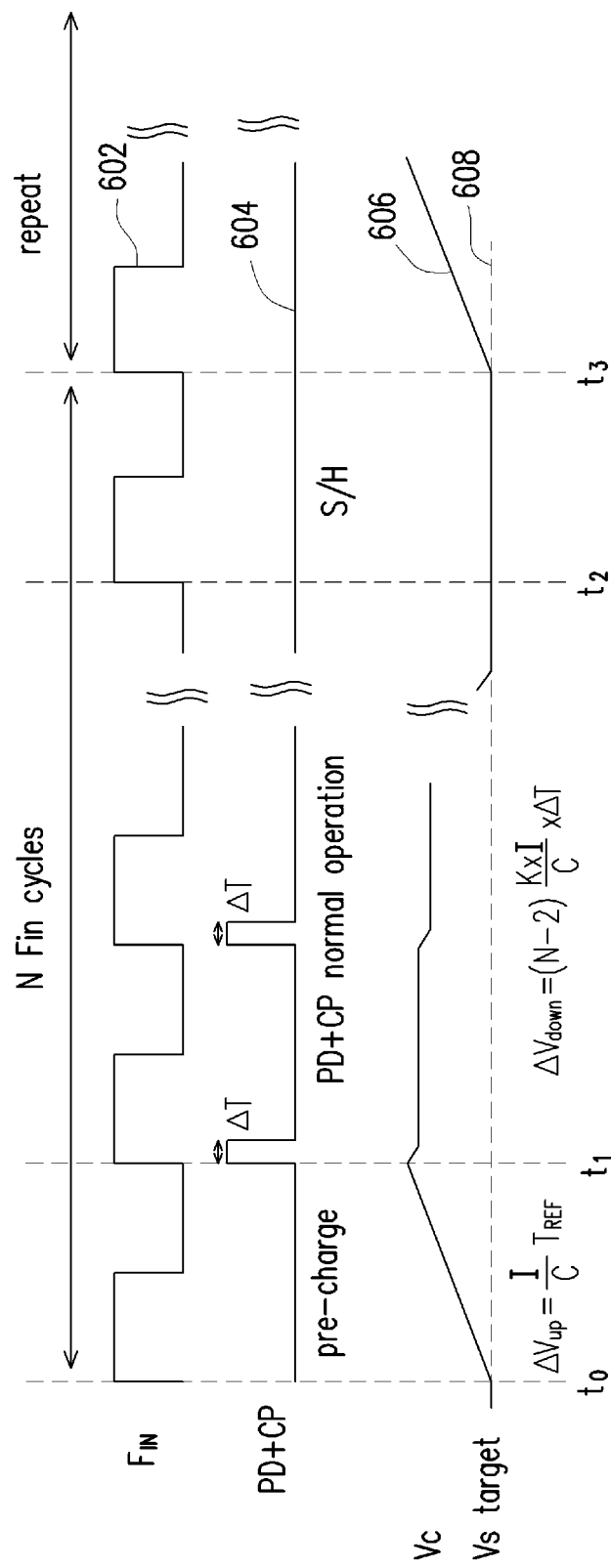
FIG. 6 illustrates a timing diagram of signals of N clock cycles of a phase skew generator divided into three operating regions, where N is an integer greater than 3, in accordance with some embodiments.

In order to address the EM issue discussed above, in some embodiments, the controller 112 can split N $F_{IN}$ cycles into 3 regions, where N is an integer greater than or equal to 4, for example. FIG. 6 illustrates a timing diagram of $F_{IN}$ 602, ΔT 604 (as reflected by the output of PD 102 and input of CP 104), $V_C$ 606 and $V_S$ 608 when N FIN clock cycles are divided into a pre-charge region, normal operation region, and a sample and hold region, in accordance with some embodiments. The pre-charge region has a period or operation duration of one $F_{IN}$ clock cycle, the normal operation region has a period of N−2 clock cycles, and the S/H region has a period of one clock cycle. In other words, the normal operation period $(t_2-t_1)$ is N−2 clock cycles long. Thus, during normal operation, the CP 104 will discharge the capacitor 106 with K times the unit current I (i.e., K×I) over a period of N−2 clock cycles of FIN (i.e., (N−2)×Tref).

As shown in FIG. 6, in the normal operation region, ΔVc is equal to $[(N-2)KI/C]\times\Delta T$. If VCDL 110 includes 4 delay line stages (i.e., $\Delta T=4\Delta\theta$), and if we set the pump current ratio (K) equal to 3, and N equal to 25, for example, we can achieve a phase skew Δθ equal to Tref/276, which is one exemplary design target. However, in this embodiment, the current KI can be discharged over a much larger time period and thus the amount of current discharged over a single clock cycle can be reduced by a factor of N−2. If N=25, for example, the current is reduced by a factor of 23 times, which significantly alleviates or solves the EM issues discussed above. Referring again to FIG. 1, the value of N can be set by a user via an input to the controller 112. Based on this input, the controller 112 will set the number of clock cycles for the normal operating region to N−2 cycles, in accordance with some embodiments.

Figure 7:
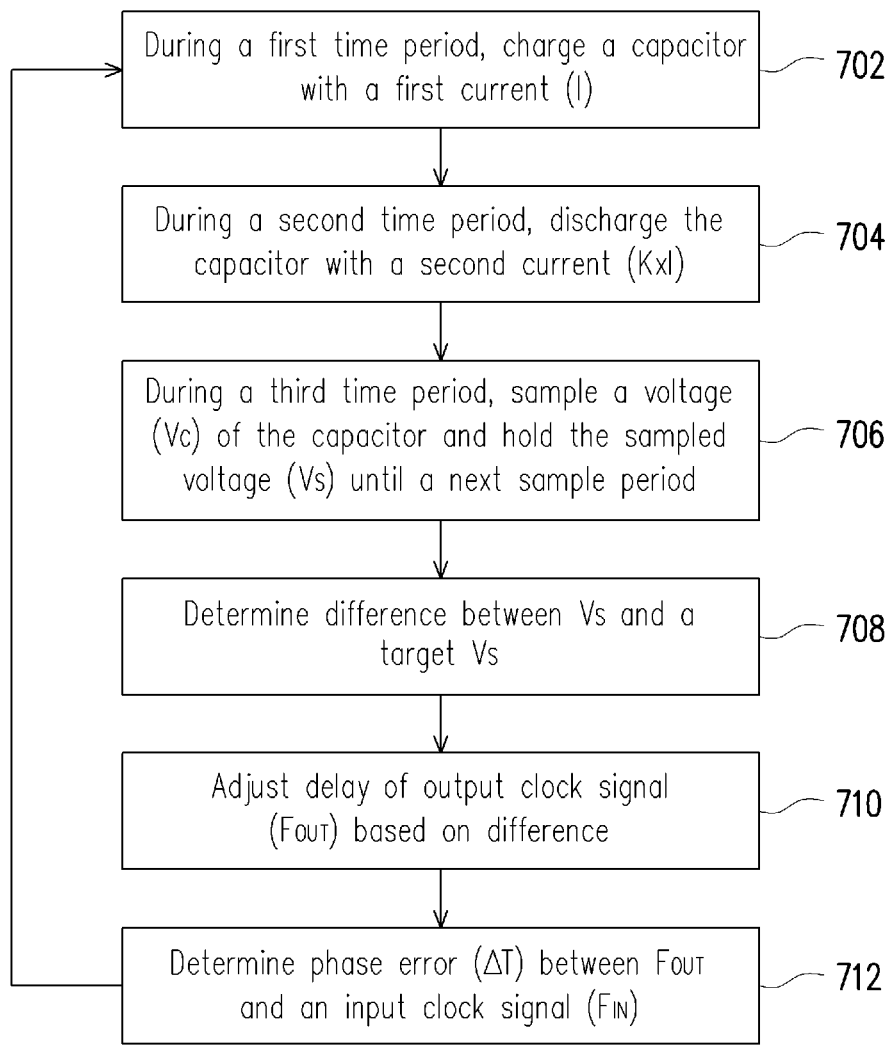
FIG. 7 illustrates a flow chart of a method of generating precision phase skews, in accordance with some embodiments.

FIG. 7 illustrates a flow chart of a method 700 of generating precision phase skews, in accordance with some embodiments. At operation 702, during a first time period, a capacitor is charged with a predetermined current (I) based on a previously determined phase error (ΔT) between an input clock signal ($F_{IN}$) and an output clock signal ($F_{OUT}$), wherein the first time period corresponds to a period (Tref) of the input clock signal ($F_{IN}$). At operation 704, the capacitor is discharged by a multiple (K) of the predetermined current (I) during a second time period following the first time period. At operation 706, a voltage ($V_C$) of the capacitor is sampled at a predetermined time during a third time period to provide a sampled voltage ($V_S$). At operation 708, $V_S$ is compared to a target $V_S$ value and a difference between $V_S$ and the target $V_S$ is determined. At operation 710, an amount of delay (i.e., phase offset) of the output clock signal ($F_{OUT}$) is adjusted, as necessary, based on the difference between $V_S$ and the target $V_S$. At operation 712, a phase error (ΔT) between $F_{IN}$ and $F_{OUT}$ is determined. After operation 712, the method 700 returns to operation 702, where the phase error (ΔT) obtained during operation 712 is used to adjust a charging parameter for charging the capacitor (e.g., a duration of charging during the second time period).

In some embodiments, the amount of delay of $F_{OUT}$ is adjusted by a VCDL having S delay line stages, where S is an integer greater than or equal to 2. Thus, the phase error ΔT is equal to SΔθ, where Δθ is the phase skew between output signals of immediately adjacent delay line stages of the VCDL. In some embodiments, the second time period equals one input clock cycle, and Δθ equals Tref/(K×S). In some embodiments, the second time period equals N−2 input clock cycles and Δθ equals Tref/[K×(N−2)×S].

In alternative embodiments, the pre-charge mode can be replaced with a pre-discharge mode and normal operation can be a charging operation instead of discharging operation, as discussed above. In such alternative embodiments, during a pre-discharge mode, the second switch 408 is closed to provide a pre-discharge path for the loop filter through the second current source 406. Then, during a normal operation mode, the third switch 412 is closed to provide a normal charging path for current K×I from the third current source 412 to the loop filter. As would be understood by persons of ordinary skill in the art, the principles of operation of the phase skew generator 100 in such alternative embodiments remain substantially the same as discussed above with respect to FIGS. 5 and 6 in order to generate precision phase skews. Therefore, a discussion of such operation is not repeated here.

As described above, methods and apparatuses for generating precision phase skews are provided. The precision phase skew output is controllable and determined by a current ratio between charge and discharge operation regions, in accordance with some embodiments. The methods and apparatuses addresses the drawbacks of prior methods that would require a large number of delay line stages. As disclosed herein, the number of delay line stages in a VCDL can be significantly reduce (e.g., 276 to 4 stages, a factor of 69). Additionally, in some embodiments, EM performance of the precision phase skew generator can be improved by dividing N clock cycles of operation into 1 pre-charge/pre-discharge region, N−2 normal operation regions, and 1 S/H region, as described above.

In some embodiments, a phase skew generator includes: a phase detector configured to detect a phase error between an input clock signal and an output clock signal of the phase skew generator; a charge pump, coupled to the phase skew generator, the charge pump having a first mode of operation and a second mode of operation, wherein the first mode of operation provides a first current path during a first time period, and the second mode of operation provides a second current path during a second time period following the first time period; a capacitor, coupled to the charge pump, and configured to be charged and discharged by the charge pump, wherein the capacitor provides a voltage level reflecting the phase error; a sample and hold circuit, coupled to the capacitor, configured to sample the voltage level at predetermined times and provide an output voltage during a third time period following the second time period; and a voltage controlled delay line, coupled to the sample and hold circuit, configured to output the output clock signal, wherein the VCDL comprises M delay line stages each configured to output a signal having a phase skew offset from a signal output of an immediately preceding or succeeding delay line stage, and a last delay stage provides the output signal, where M is an integer greater than or equal to 2. In some embodiments, the first current path is configured to conduct a first current, and the second current path is configured to conduct a second current, wherein the second current is greater than the first current. In some embodiments, the second current is a multiple K times the first current, where K is an integer greater than or equal to 2. In some embodiments, each of the first, second and third periods of time has a duration of one cycle of the input clock signal. In alternative embodiments, each of the first and third periods of time has a duration of one cycle of the input clock signal, and the second time period has a duration of a plurality of cycles of the input clock signal.

In further embodiments, a phase skew generator includes: a phase detector configured to detect a phase error between an input signal and an output signal of the phase skew generator; a charge pump, coupled to the phase skew generator, the charge pump have a pre-charge current path and a normal operation current path, wherein the pre-charge current path is configured to conduct a unit current I during a first time period, and the normal operation current path is configured to conduct a current K×I during a second time period following the first time period, where K is an integer greater than 1; a capacitor, coupled to the charge pump, and configured to be charged and discharged by the charge pump, wherein the capacitor provides a voltage level reflecting the phase error; a sample and hold circuit, coupled to the capacitor, configured to sample the voltage level at predetermined times and provide an output voltage during a third time period following the second time period; and a voltage controlled delay line, coupled to the sample and hold circuit, configured to output the output signal, wherein the VCDL comprises M delay line stages each configured to output a signal having a phase skew offset from a signal output of an immediately preceding or succeeding delay line stage, and a last delay stage provides the output signal, where M in an integer greater than 3.

In some embodiments, a method of generating a plurality of signals offset from each other by a phase skew, includes: charging a capacitor with a first current during a first time period; discharging the capacitor with a second current during a second time period following the first time period, wherein the second current is larger than the first current; sampling a voltage level of the capacitor to provide a sampled voltage ($V_S$) during a third time period following the second time period; determining a difference between $V_S$ and a target $V_S$ value; adjusting a delay of an output clock signal based on the difference; and determining a phase error between the output clock signal and an input clock signal, wherein a parameter for charging the capacitor is adjusted based on the phase error, and the phase skew of the plurality of signals is equal to the phase error divided by M, where M is an integer greater than or equal to 2.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A phase skew generator, comprising:
   a phase detector configured to detect a phase error between an input clock signal and an output clock signal of the phase skew generator;
   a charge pump, coupled to the phase skew generator, the charge pump having a first mode of operation and a second mode of operation, wherein the first mode of operation provides a first current path during a first time period, and the second mode of operation provides a second current path during a second time period following the first time period, wherein the first current path is configured to conduct a first current, and the second current path is configured to conduct a second current, wherein the second current is greater than the first current;
   a sample and hold circuit, coupled to the charge pump, configured to sample a voltage level reflecting the phase error at predetermined times and provide an output voltage during a third time period following the second time period; and
   a capacitor, coupled to the charge pump, and configured to be charged and discharged by the charge pump, wherein the capacitor provides the voltage level, wherein the first current path is configured to charge the capacitor with the first current (I) and the second current path is configured to discharge the capacitor with the second current (K×I).

2. The phase skew generator of claim 1, wherein the second current is a multiple K times the first current, where K is an integer greater than or equal to 2.

3. The phase skew generator of claim 2, wherein K is greater than or equal to 3.

4. The phase skew generator of claim 1, wherein the first current path is configured to discharge the capacitor with the first current (I) and the second current patent is configured to charge the capacitor with the second current (K×I).

5. The phase skew generator of claim 1, further comprising a controller coupled to the charge pump and the sample hold circuit, wherein the controller is configured to control when the charge pump operates in the first and second modes of operation, and the predetermined times when the sample and hold circuit samples the voltage level of the capacitor.

6. The phase skew generator of claim 1, wherein each of the first, second and third time periods has a duration of one cycle of the input clock signal.

7. The phase skew generator of claim 1, wherein each of the first and third time periods has a duration of one cycle of the input clock signal, and the second time period has a duration of a plurality of cycles of the input clock signal.

8. The phase skew generator of claim 1, further comprising:
   a voltage controlled delay line (VCDL), coupled to the sample and hold circuit, configured to output the output clock signal, wherein the VCDL comprises M delay line stages each configured to output a signal having a phase skew offset from a signal output of an immediately preceding or succeeding delay line stage, a last delay line stage providing the output clock signal, where M in an integer greater than or equal to 2 and each phase skew between successive signals output by the M delay line stages is equal to the phase error divided by M.

9. A phase skew generator, comprising:
a phase detector configured to detect a phase error between an input signal and an output signal of the phase skew generator;
a charge pump, coupled to the phase skew generator, the charge pump have a pre-charge current path and a normal operation current path, wherein the pre-charge current path is configured to conduct a first current during a first time period, and the normal operation current path is configured to conduct a second current during a second time period following the first time period, wherein the first current is different than the second current; and
a voltage controlled delay line (VCDL), coupled to the charge pump, configured to output the output signal, wherein the VCDL comprises M delay line stages each configured to output a signal having a phase skew offset from a signal output of an immediately preceding or succeeding delay line stage, and a last delay stage provides the output signal, wherein M is in an integer greater than or equal to 2.

10. The phase skew generator of claim 9, further comprising a controller coupled to the charge pump, wherein the controller is configured to control when the charge pump operates in the pre-charge region and the normal operation region.

11. The phase skew generator of claim 9, wherein each of the first and second time periods has a duration of one cycle of the input clock signal.

12. The phase skew generator of claim 9, wherein the first time period has a duration of one cycle of the input clock signal, and the second time period has a duration of a plurality of cycles of the input clock signal.

13. The phase skew generator of claim 9, wherein M equals 4 and each phase skew between successive signals output by the M delay line stages is equal to the phase error divided by 4.

14. A method of generating a plurality of signals, the method comprising:
providing a first current during a first time period;
providing a second current during a second time period following the first time period, wherein the second current is different than the first current;
charging a capacitor with the first current during the first time period;
charging the capacitor with the second current during the second time period;
sampling a voltage level output by the capacitor representative of a phase error between an input signal and an output signal to provide a sampled voltage ($V_S$) during a third time period following the second time period;
determining a difference between $V_S$ and a target $V_S$ value; and
adjusting a delay of an output clock signal based on the difference.

15. The method of claim 14, wherein a phase skew of the input and output signals is equal to the phase error divided by M, where M corresponds to a number of delay line stages in a voltage controlled delay line.

16. The method of claim 15, wherein the second current is a multiple K times the first current, where K is an integer greater than or equal to 2, and wherein M equals 4 and each phase skew between successive signals output by the M delay line stages is equal to the phase error divided by 4.

17. The method of claim 15, wherein M equals 4 and each phase skew between successive signals output by the M delay line stages is equal to the phase error divided by 4.

18. The method of claim 14, wherein the second current is a multiple K times the first current, where K is an integer greater than or equal to 2.

19. The method of claim 14, wherein each of the first, second and third time periods has a duration of one cycle of the input clock signal.

20. The method of claim 14, wherein each of the first and third time periods has a duration of one cycle of the input clock signal, and the second time period has a duration of a plurality of cycles of the input clock signal.

* * * * *